United States Patent
Yang et al.

(10) Patent No.: US 12,051,618 B2
(45) Date of Patent: Jul. 30, 2024

(54) METHODS FOR FORMING SEMICONDUCTOR STRUCTURES AND SEMICONDUCTOR STRUCTURES

(71) Applicant: CHANGXIN MEMORY TECHNOLOGIES, INC., Hefei (CN)

(72) Inventors: Nianwang Yang, Hefei (CN); Yuchen Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 401 days.

(21) Appl. No.: 17/430,279

(22) PCT Filed: Feb. 8, 2021

(86) PCT No.: PCT/CN2021/075941
§ 371 (c)(1),
(2) Date: Aug. 11, 2021

(87) PCT Pub. No.: WO2021/169786
PCT Pub. Date: Sep. 2, 2021

(65) Prior Publication Data
US 2023/0116971 A1 Apr. 20, 2023

(30) Foreign Application Priority Data
Feb. 27, 2020 (CN) .......................... 202010123734.4

(51) Int. Cl.
*H01L 21/4763* (2006.01)
*H01L 21/768* (2006.01)

(52) U.S. Cl.
CPC .... *H01L 21/7682* (2013.01); *H01L 21/76885* (2013.01)

(58) Field of Classification Search
CPC .................................................. H01L 21/7682
(Continued)

(56) References Cited

U.S. PATENT DOCUMENTS 6,100,205 A 8/2000 Liu et al.
6,469,339 B1 * 10/2002 Onakado ................ H10B 41/30
438/257

(Continued)

FOREIGN PATENT DOCUMENTS

CN 1791974 A 6/2006
CN 102479811 A 5/2012
(Continued)

OTHER PUBLICATIONS

International Search Report cited in PCT/CN2021/075941 mailed Feb. 27, 2020, 8 pages.
(Continued)

*Primary Examiner* — Nitin Parekh
(74) *Attorney, Agent, or Firm* — Kilpatrick Townsend & Stockton LLP

(57) ABSTRACT

The present invention relates to the technical field of semiconductor manufacturing, and in particular, to a method for forming a semiconductor structure and a semiconductor structure. The method for forming a semiconductor structure comprises: forming an interconnect layer and a conductive layer covered on a surface of the interconnect layer; forming a protective layer covering a surface of the conductive layer away from the interconnect layer; forming a trench penetrating the protective layer and the conductive layer; and filling a dielectric layer in the trench, and forming an air gap in the dielectric layer, the air gap extending from the trench in the conductive layer into the trench in the protective layer.

9 Claims, 3 Drawing Sheets

(58) Field of Classification Search
USPC .................................................. 438/319, 411
See application file for complete search history.

(56) References Cited

U.S. PATENT DOCUMENTS

| | | | |
|---|---|---|---|
| 7,569,465 | B2 | 8/2009 | Chen et al. |
| 2006/0001073 | A1* | 1/2006 | Chen ...................... H10B 41/30 |
| | | | 257/314 |
| 2006/0051969 | A1 | 3/2006 | Nakajima et al. |
| 2007/0252192 | A1* | 11/2007 | Mokhlesi ............... H10B 69/00 |
| | | | 438/257 |
| 2012/0007165 | A1 | 1/2012 | Lee et al. |
| 2012/0074484 | A1 | 3/2012 | Kang et al. |
| 2014/0159135 | A1* | 6/2014 | Fujimoto .......... H01L 21/76224 |
| | | | 257/324 |
| 2014/0242792 | A1 | 8/2014 | Liu et al. |
| 2015/0236111 | A1 | 8/2015 | Lee et al. |
| 2015/0262860 | A1* | 9/2015 | Kao .................. H01L 23/53295 |
| | | | 438/653 |
| 2017/0148874 | A1* | 5/2017 | Ok ........................ H01L 23/535 |
| 2018/0166553 | A1* | 6/2018 | Lee ....................... H01L 21/311 |
| 2018/0277430 | A1* | 9/2018 | Xie .................... H01L 29/6653 |
| 2019/0139812 | A1* | 5/2019 | Lin .................. H01L 23/53295 |

FOREIGN PATENT DOCUMENTS

| | | |
|---|---|---|
| CN | 103151301 A | 6/2013 |
| CN | 106328582 A | 1/2017 |

OTHER PUBLICATIONS

First Office Action and English Translation cited in CN 202010123734.4, mailed Feb. 16, 2022, 13 pages.

* cited by examiner

METHODS FOR FORMING SEMICONDUCTOR STRUCTURES AND SEMICONDUCTOR STRUCTURES

CROSS-REFERENCE TO RELATED APPLICATIONS

The present application claims the priority to Chinese patent application 202010123734.4, titled "METHODS FOR FORMING SEMICONDUCTOR STRUCTURES AND SEMICONDUCTOR STRUCTURES", filed on Feb. 27, 2020, which is incorporated herein by reference in its entirety.

TECHNICAL FIELD

The present invention relates to the technical field of semiconductor manufacturing, and in particular, to a method for forming a semiconductor structure and a semiconductor structure.

BACKGROUND OF THE PRESENT INVENTION

Dynamic random access memories (DRAMs), as semiconductor structures commonly used in electronic devices such as computers, are composed of a plurality of storage units, each of which usually comprises a transistor and a capacitor. Gates of the transistors are electrically connected to word lines, sources thereof are electrically connected to bit lines, and drains thereof are electrically connected to the capacitors. The word line voltage on the word lines can control the on or off of the transistors, so that data information stored in the capacitors can be read or data information can be written into the capacitors by using the bit lines.

As the feature size of semiconductor structures such as DRAMs continues to decrease, the delay of the back-end metal interconnection resistor capacitor (RC) has shown a significant increase. In order to reduce the RC delay, the present main approach is to introduce low dielectric constant materials. However, in the process of etching metal to form trenches in which low dielectric constant materials are filled, metal chamfering and/or metal collapse often occur. In addition, the formation of air gaps in the process of filling the low dielectric constant materials is helpful to reduce the parasitic capacitance between the metal interconnect lines. However, at present, the currently formed air gaps are low in height, which leads to an increased risk of cracks in the metal.

Therefore, how to reduce metal chamfering and collapse in the etching process and also reduce the risk of cracks in the metal so as to improve the performance of the semiconductor structure is a technical problem that needs to be solved urgently.

SUMMARY OF THE PRESENT INVENTION

The present invention provides a method for forming a semiconductor structure and a semiconductor structure, to solve metal chamfering and collapse during the formation of metal interconnect lines in existing semiconductor structure, and to reduce the risk of cracks in the metal layer and improve the performance of the semiconductor structure.

In order to solve the problem mentioned above, the present invention provides a method for forming a semiconductor structure, comprising:

forming an interconnect layer and a conductive layer covered on a surface of the interconnect layer;
forming a protective layer covering a surface of the conductive layer away from the interconnect layer;
forming a trench penetrating the protective layer and the conductive layer; and
filling a dielectric layer in the trench, and forming an air gap in the dielectric layer, the air gap extending from the trench in the conductive layer into the trench in the protective layer.

Optionally, the interconnect layer comprises a plurality of interconnect lines and isolation layers located between the adjacent interconnect lines; and forming an interconnect layer and a conductive layer covered on the surface of the interconnect layer comprises:

forming a first adhesive layer on the surface of the interconnect layer; and
depositing metal material on a surface of the first adhesive layer away from the interconnect layer, to form the conductive layer.

Optionally, forming a protective layer covering a surface of the conductive layer away from the interconnect layer comprises:

forming a second adhesive layer on a surface of the conductive layer away from the first adhesive layer; and
depositing dielectric material on a surface of the second adhesive layer to form the protective layer.

Optionally, depositing dielectric material on a surface of the second adhesive layer comprises:

depositing the dielectric material on the surface of the second adhesive layer by a plasma-enhanced chemical vapor deposition process or a high-density plasma chemical vapor deposition process.

Optionally, the protective layer is made of one or a combination of two or more of oxide materials, nitride materials and oxynitride materials.

Optionally, forming a trench penetrating the protective layer and the conductive layer comprises:

etching at least the protective layer, the second adhesive layer, the conductive layer and the first adhesive layer to form the trench penetrating the protective layer, the second adhesive layer, the conductive layer and the first adhesive layer.

Optionally, forming a trench penetrating the protective layer and the conductive layer comprises:

etching the protective layer, the second adhesive layer, the conductive layer, the first adhesive layer and part of the isolation layer, to form the trench penetrating the protective layer, the second adhesive layer, the conductive layer and the first adhesive layer and extending into the isolation layer.

Optionally, filling a dielectric layer in the trench comprises:

filling the dielectric layer in the trench by a high-density plasma deposition process.

Optionally, a top surface of the air gap is flush with a top surface of the protective layer; or
the top surface of the air gap is below the top surface of the protective layer.

In order to solve the problem mentioned above, the present invention further provides a semiconductor structure formed by the method for forming a semiconductor structure described in any one of the above.

In the method for forming a semiconductor structure and the semiconductor structure according to the present invention, on one hand, by forming the protective layer on the surface of the conductive layer, chamfering can be eliminated in the protective layer during the etching of the conductive layer to form the trench, thereby reducing or even avoiding chamfering and collapse in the conductive layer; and on the other hand, by forming the protective layer, the height of the trench can be increased so that the air gap can extend into the trench in the protective layer, and the increase in the height of the air gap greatly reduces the risk of cracks in the metal layer. The above two aspects will significantly improve the performance of the semiconductor structure.

DETAILED DESCRIPTION OF THE PRESENT INVENTION

The specific implementation of the method for forming a semiconductor structure and the semiconductor structure according to the present invention will be described in detail below with reference to the accompanying drawings.

Figure 1:
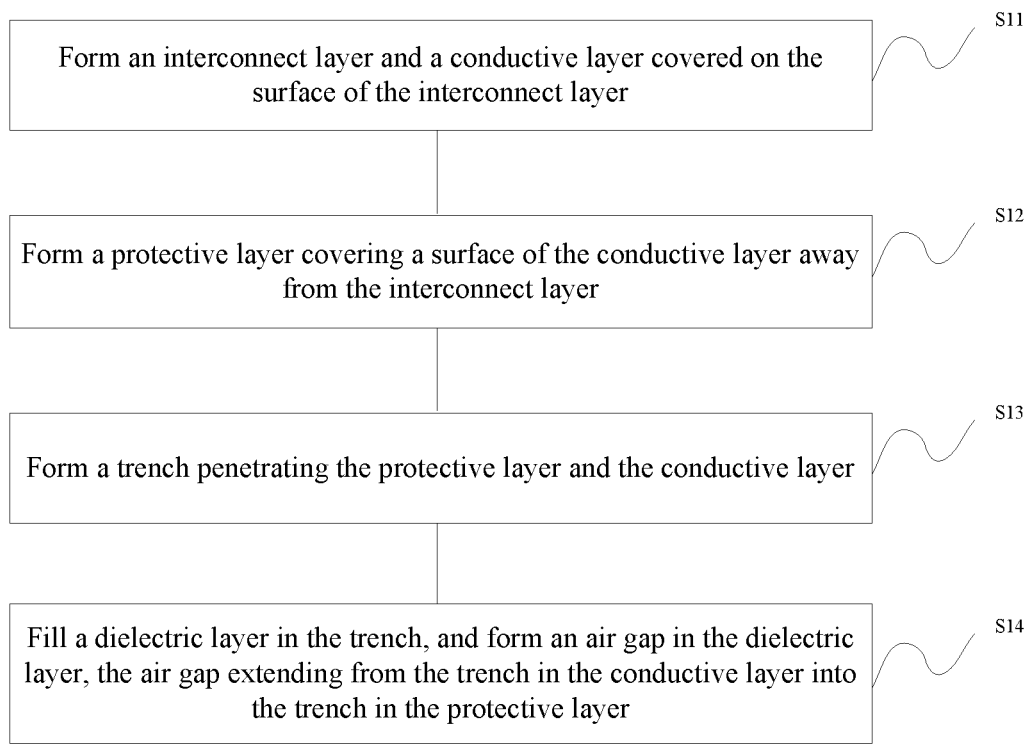
FIG. 1 is a flowchart of a method for forming a semiconductor structure in a specific implementation of the present invention.

This implementation provides a method for forming a semiconductor structure. FIG. 1 is a flowchart of a method for forming a semiconductor structure in the specific implementation of the present invention; and FIGS. 2A-2E are schematic cross-sectional views of main processes in the process of forming a semiconductor structure in the specific implementation of the present invention. As shown in FIG. 1 and FIGS. 2A-2E, the method for forming a semiconductor structure in this implementation comprises following steps.

Figure 2A:
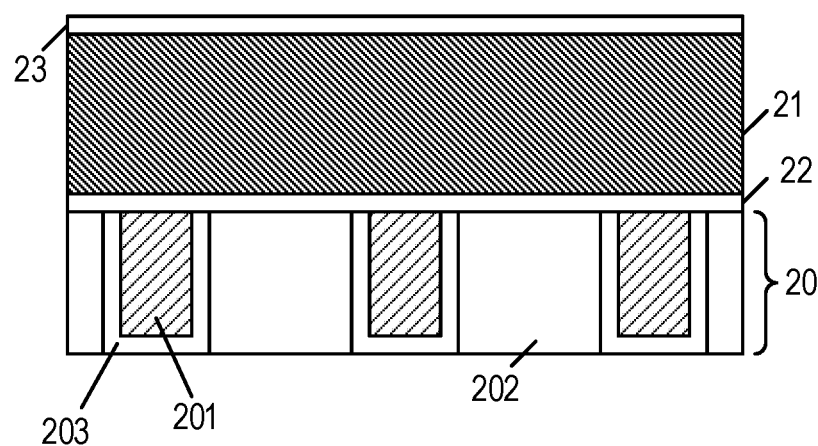
FIGS. 2A-2E are schematic cross-sectional views of main processes in the process of forming a semiconductor structure in the specific implementation of the present invention.

S11: An interconnect layer 20 and a conductive layer 21 covered on the surface of the interconnect layer 20 are formed, as shown in FIG. 2A.

Optionally, the interconnect layer 20 comprises a plurality of interconnect lines 201 and isolation layers 202 located between the adjacent interconnect lines; and forming an interconnect layer 20 and a conductive layer 21 covered on the surface of the interconnect layer 20 specifically comprises:

forming a first adhesive layer 22 on the surface of the interconnect layer 20; and depositing a metal material on the surface of the first adhesive layer 22 away from the interconnect layer 20 to form the conductive layer 21.

Specifically, the interconnect layer 20 comprises a plurality of interconnect lines 201 independent of each other, and the interconnect lines 201 are made of a metal material, for example tungsten. The adjacent interconnect lines 201 are electrically isolated by the isolation layers 202, and the materials for the isolation layers 202 may be, but are not limited to, oxide materials. In order to enhance the adhesion between the interconnect lines 201 and the isolation layers 202, third adhesive layer 203 may be provided between the interconnect lines 201 and the isolation layers 202. The third adhesive layer 203 may be made of a combination of Ti and TIN.

In order to enhance the adhesion between the interconnect layers 20 and the conductive layer 21, before depositing the conductive layer 21, the first adhesive layer 22 is deposited before the surface of the interconnect lines 201 (that is, the top surface of the interconnect lines 201) is exposed in the interconnect layer 20. The first adhesive layer 22 covers the interconnect lines 201, the isolation layer 202, and the third adhesive layer 203, that is, the first adhesive layer 22 covers the entire surface of the interconnect layer 20. The first adhesive layer 22 may be made of a combination of Ti and TIN. Then, the conductive layer 21 is deposited on the surface of the first adhesive layer 22 away from the interconnect layer 20 by a chemical vapor deposition, physical vapor deposition or atomic layer deposition process. The conductive layer 21 is preferably made of a metal material, for example aluminum.

S12: A protective layer 24 covering the surface of the conductive layer 21 away from the interconnect layer 20 is formed, as shown in FIG. 2B.

Figure 2B:
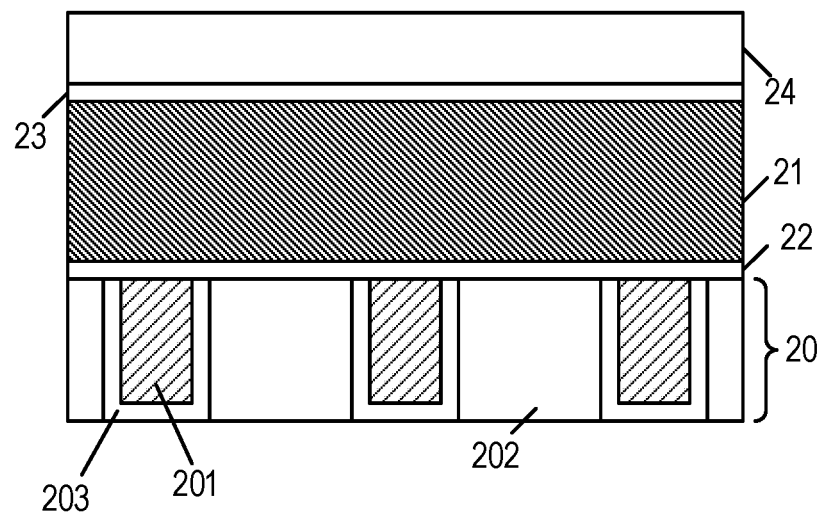

Optionally, forming a protective layer 24 covering the surface of the conductive layer 21 away from the interconnect layer 20 specifically comprises:

forming a second adhesive layer 23 on the surface of the conductive layer 21 away from the first adhesive layer 22, as shown in FIG. 2A; and depositing a dielectric material on the surface of the second adhesive layer 23 to form the protective layer 24, as shown in FIG. 2B.

Specifically, in order to enhance the adhesion between the protective layer 24 and the conductive layer 21, before the protective layer 24 is deposited, the second adhesive layer 23 is formed on the entire surface of the conductive layer 21 away from the first adhesive layer 22. The second adhesive layer 23 may also be made of a combination of Ti and TIN. The specific thickness of the protective layer 24 may be determined by those skilled in the art according to actual needs, for example, according to the type of etchant used for subsequent etching of the protective layer 24 and the conductive layer 21, the feature size of the trench to be formed by etching, the materials for the protective layer 24 and the conductive layer 21, etc. The specific thickness of the protective layer 24 is not limited in this specific implementation, as long as the chamfering in the conductive layer 21 can be reduced during the etching process. The thickness of the protective layer 24 is preferably greater than the thickness of the second adhesive layer 23.

Optionally, depositing the protective layer 24 on the surface of the second adhesive layer 23 specifically comprises:

depositing a dielectric material on the surface of the second adhesive layer 23 by a plasma-enhanced chemical vapor deposition process or a high-density plasma chemical vapor deposition process.

The protective layer 24 formed by the plasma-enhanced chemical vapor deposition process or the high-density plasma chemical vapor deposition process is relatively dense, and the formed protective layer 24 is relatively uniform in thickness, so that it better protects the conductive layer 21 in the subsequent etching process.

The specific material for the protective layer 24 may be determined by those skilled in the art according to actual needs. Optionally, the protective layer 24 is made of one or a combination of two or more of oxide materials, nitride materials and oxynitride materials. In this specific implementation, the protective layer 24 may be made of the same material as the isolation layer 202, for example, both are made of oxide materials (for example silicon dioxide), so as to save the manufacturing cost of the semiconductor structure.

Figure 2C:
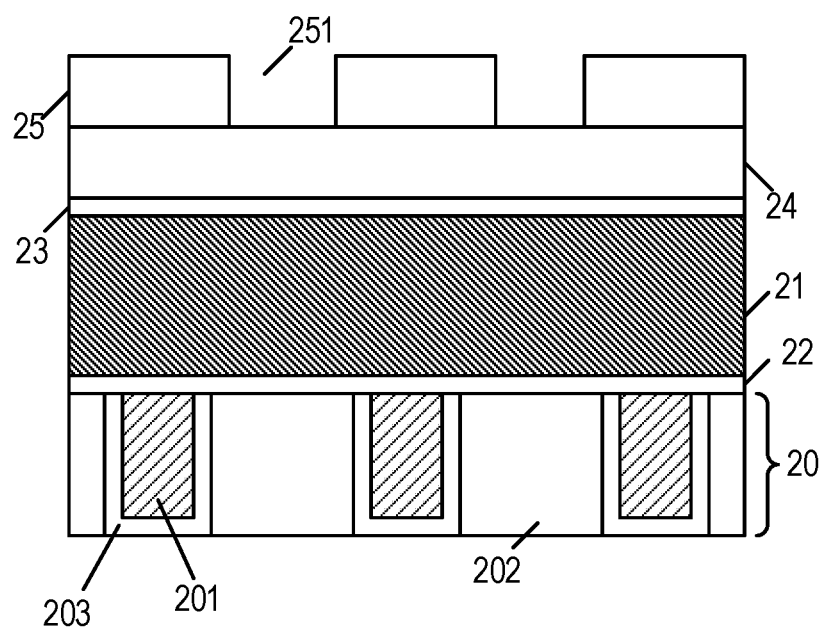
Figure 2D:
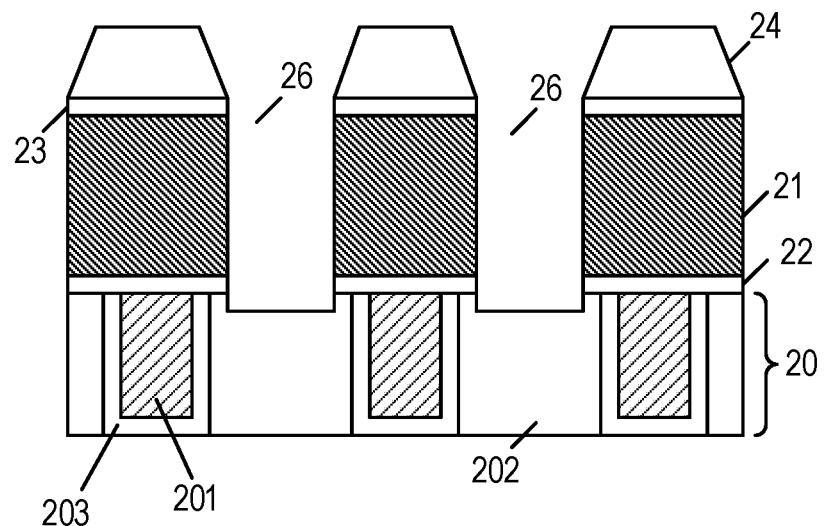
Figure 2E:
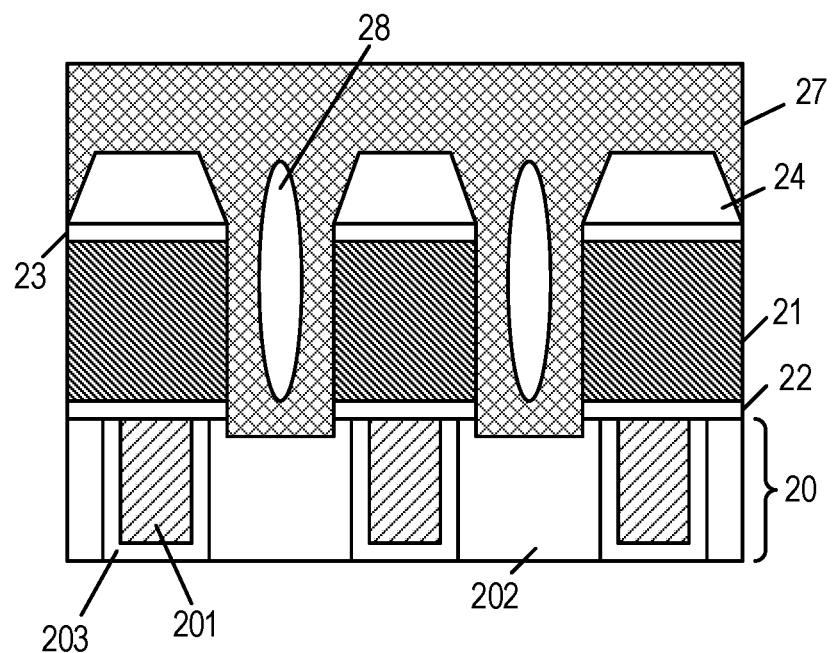

S13: A trench 26 penetrating the protective layer 24 and the conductive layer 21 is formed, as shown in FIG. 2D.

Optionally, forming a trench 26 penetrating the protective layer 24 and the conductive layer 21 specifically comprises:

etching at least the protective layer 24, the second adhesive layer 23, the conductive layer 21 and the first adhesive layer 22 to form the trench 26 penetrating the protective layer 24, the second adhesive layer 23, the conductive layer 21 and the first adhesive layer 22.

Optionally, forming a trench 26 penetrating the protective layer 24 and the conductive layer 21 specifically comprises:

etching the protective layer 24, the second adhesive layer 23, the conductive layer 21, the first adhesive layer 22 and part of the isolation layer 202 to form the trench 26 penetrating the protective layer 24, the second adhesive layer 23, the conductive layer 21 and the first adhesive layer 22 and extending into the isolation layer 202.

Specifically, after the protective layer 24 is formed, a patterned photoresist layer 25 is formed on the surface of the protective layer 24 away from the second adhesive layer 23. The patterned photoresist layer 25 has an opening 251 from which the protective layer 24 is exposed, as shown in FIG. 2C. Then, the protective layer 24, the second adhesive layer 23, the conductive layer 21, the first adhesive layer 22 and part of the isolation layer 202 may be etched sequentially along the opening 251 by a dry etching process or a wet etching process, so that the formed trench 26 sequentially penetrates the protective layer 24, the second adhesive layer 23, the conductive layer 21 and the first adhesive layer 22, and extends into the isolation layer 202. Through the etching in this step, the conductive layer 21 may be divided into a plurality of sub-conductive layers isolated from each other by the trench 26, and each of the sub-conductive layers is electrically connected to the interconnect lines 201 below it. By extending the trench 26 into the isolation layer 202, the first adhesive layer 22 and the conductive layer 21 can be sufficiently separated.

In the etching process, since the protective layer 24 has been formed on the surface of the conductive layer 21, chamfering caused by the etching occurs in the protective layer 24, as shown in FIG. 2D, thereby reducing or even avoiding chamfering or collapse in the conductive layer 21, and improving the performance of the finally formed semiconductor structure.

In this specific implementation, the extension of the trench 26 into the isolation layer 202 is taken as an example for description. In other specific implementations, it may be determined by those skilled in the art, according to actual needs, to allow the trench to only penetrate the protective layer, the second adhesive layer, the conductive layer and the first adhesive layer, without extending into the isolation layer 202.

S14: A dielectric layer 27 is filled in the trench 26, and an air gap 28 is formed in the dielectric layer 27, the air gap 28 extending from the trench 26 in the conductive layer 21 into the trench 26 in the protective layer 24.

Optionally, filling a dielectric layer 27 in the trench 26 specifically comprises:

filling a dielectric layer 27 in the trench 26 by a high-density plasma deposition process.

Specifically, according to the required size of the air gap 28, part of the dielectric layer 27 is deposited on the sidewalls and bottom of the trench 26 by a high-density plasma deposition process. The dielectric layer 27 deposited this time does not completely fill the trench 26. Then, the trench 26 is sealed by a high-density plasma deposition process to form the dielectric layer 27 with the air gap 28.

In this specific implementation, since the protective layer 24 is covered on the surface of the conductive layer 21, and the trench 26 penetrates the conductive layer 21 and the protective layer 24, the depth of the formed trench 26 is relatively large, so that the air gap 28 with a relatively high height can be formed. That is, the air gap 28 can extend from the trench 26 in the conductive layer 21 into the trench 26 in the protective layer 24. The increase in the height of the air gap 28 is helpful to reduce the risk of cracks in the conductive layer 21 and further ensures the stability of the performance of the semiconductor structure. The material for the dielectric layer 27 may be determined by those skilled in the art according to actual needs. For example, lower dielectric constant materials, such as oxide materials, may be used.

Optionally, the top surface of the air gap 28 is flush with the top surface of the protective layer 24; or the top surface of the air gap 28 is below the top surface of the protective layer 24.

Specifically, the air gap 28 extends from the trench 26 in the conductive layer 21 into the trench in the protective layer 24. The height at which the air gap 28 extends out of the conductive layer 21 may be the same as the thickness of the protective layer 24 (that is, the top surface of the air gap 28 is flush with the top surface of the protective layer 24); or the height at which the air gap 28 extends out of the conductive layer 21 is less than the thickness of the protective layer 24 (that is, the top surface of the air gap 28 is below the top surface of the protective layer 24). The bottom surface of the air gap 28 may be flush with the bottom surface of the conductive layer 21, or may be below the bottom surface of the conductive layer 21, or may be above the bottom surface of the conductive layer 21. This may be determined by those skilled in the art according to actual needs.

Moreover, this specific implementation further provides a semiconductor structure formed by the method for forming a semiconductor structure described in any one of the above. For the schematic diagram of the semiconductor structure in this implementation, please refer to FIG. 2E.

In the method for forming a semiconductor structure and the semiconductor structure in this specific implementation, on one hand, by forming the protective layer on the surface of the conductive layer, chamfering can be eliminated in the protective layer during the etching of the conductive layer to form the trench, thereby reducing or even avoiding chamfering and collapse in the conductive layer; and on the other hand, by forming the protective layer, the height of the trench can be increased so that the air gap can extend into the trench in the protective layer, and the increase in the height of the air gap greatly reduces the risk of cracks in the metal layer. The above two aspects will significantly improve the performance of the semiconductor structure.

The above description is a preferred implementation of the present invention, it should be noted that for a person of ordinary skill in the art, various improvements and modifications may be made without departing from the principle of the present invention, and those improvements and modifications should also be regarded as falling into the protection scope of the present invention.

The invention claimed is:

1. A method for forming a semiconductor structure, comprising:

forming an interconnect layer and a conductive layer covering a surface of the interconnect layer;

forming a protective layer covering a surface of the conductive layer away from the interconnect layer;

forming a trench penetrating the protective layer and the conductive layer by an etching process, wherein chamfering caused by the etching process occurs only in the protective layer; and filling a dielectric layer in the trench, and forming an air gap in the dielectric layer, the air gap extending from the trench in the conductive layer into the trench in the protective layer.

2. The method for forming a semiconductor structure according to claim 1, wherein the interconnect layer comprises a plurality of interconnect lines and an isolation layer located between adjacent interconnect lines of the plurality of interconnect lines; and the forming an interconnect layer and a conductive layer covering a surface of the interconnect layer comprises:

forming a first adhesive layer on the surface of the interconnect layer; and depositing a metal material on a surface of the first adhesive layer away from the interconnect layer, to form the conductive layer.

3. The method for forming a semiconductor structure according to claim 2, wherein the forming a protective layer covering a surface of the conductive layer away from the interconnect layer comprises:

forming a second adhesive layer on the surface of the conductive layer away from the first adhesive layer; and depositing a dielectric material on a surface of the second adhesive layer to form the protective layer.

4. The method for forming a semiconductor structure according to claim 3, wherein the depositing a dielectric material on a surface of the second adhesive layer comprises:

depositing the dielectric material on the surface of the second adhesive layer by a plasma-enhanced chemical vapor deposition process or a high-density plasma chemical vapor deposition process.

5. The method for forming a semiconductor structure according to claim 3, wherein the forming a trench penetrating the protective layer and the conductive layer comprises:

etching at least the protective layer, the second adhesive layer, the conductive layer and the first adhesive layer, to form the trench penetrating the protective layer, the second adhesive layer, the conductive layer and the first adhesive layer.

6. The method for forming a semiconductor structure according to claim 5, wherein the forming a trench penetrating the protective layer and the conductive layer comprises:

etching the protective layer, the second adhesive layer, the conductive layer, the first adhesive layer and part of the isolation layer, to form the trench penetrating the protective layer, the second adhesive layer, the conductive layer and the first adhesive layer and extending into the isolation layer.

7. The method for forming a semiconductor structure according to claim 1, wherein the protective layer is made of one or a combination of two or more of oxide materials, nitride materials and oxynitride materials.

8. The method for forming a semiconductor structure according to claim 1, wherein the filling a dielectric layer in the trench comprises:

filling the dielectric layer in the trench by a high-density plasma deposition process.

9. The method for forming a semiconductor structure according to claim 1, wherein a top surface of the air gap is flush with a top surface of the protective layer; or the top surface of the air gap is below the top surface of the protective layer.

\* \* \* \* \*